United States Patent
Miller

(10) Patent No.: US 9,359,671 B2
(45) Date of Patent: Jun. 7, 2016

(54) COATING A SUBSTANCE WITH GRAPHENE

(71) Applicant: EMPIRE TECHNOLOGY DEVELOPMENT LLC, Wilmington, DE (US)

(72) Inventor: Seth Adrian Miller, Englewood, CO (US)

(73) Assignee: Empire Technology Development LLC, Wilmington, DE (US)

( * ) Notice: Subject to any disclaimer, the term of this patent is extended or adjusted under 35 U.S.C. 154(b) by 115 days.

(21) Appl. No.: 14/176,833

(22) Filed: Feb. 10, 2014

(65) Prior Publication Data

US 2014/0190407 A1 Jul. 10, 2014

Related U.S. Application Data

(63) Continuation of application No. 13/517,458, filed on Jun. 20, 2012, now Pat. No. 8,691,335.

(51) Int. Cl.
| | |
|---|---|
| *C23C 16/26* | (2006.01) |
| *B32B 9/00* | (2006.01) |
| *B82Y 30/00* | (2011.01) |
| *B82Y 40/00* | (2011.01) |

(52) U.S. Cl.
CPC .............. *C23C 16/26* (2013.01); *B32B 9/007* (2013.01); *B82Y 30/00* (2013.01); *B82Y 40/00* (2013.01)

(58) Field of Classification Search
None
See application file for complete search history.

(56) References Cited

U.S. PATENT DOCUMENTS 5,508,041 A   4/1996   Lee et al.
(Continued)

FOREIGN PATENT DOCUMENTS

| WO | 2011/087913 A1 | 7/2011 |
| WO | 2011/144321 A1 | 11/2011 |
| WO | 2011/159922 A2 | 12/2011 |

OTHER PUBLICATIONS

Santini et al., Microchips as Controlled Drug-Delivery Devices, Angew. Chem. Int. Ed., 2000, 2396-2407, 39.
Lomeda et al., Diazonium Functionalization of Surfactant-Wrapped Chemically Converted Graphene Sheets, J. Am. Chem. Soc., 2008, 16201-16206, 130 (48).
Pastine et al., Chemicals on Demand with Phototriggerable Microcapsules, J. Am. Chem. Soc.,2009, 13586-13587, 131.
(Continued)

*Primary Examiner* — Erma Cameron
(74) *Attorney, Agent, or Firm* — Moritt Hock & Hamroff LLP; Steven S. Rubin, Esq.

(57) ABSTRACT

Technologies are generally described for a system and process effective to coat a substance with graphene. A system may include a first container including graphene oxide and water and a second container including a reducing agent and the substance. A third container may be operative relationship with the first container and the second container. A processor may be in communication with the first, second and third containers. The processor may be configured to control the third container to receive the graphene oxide and water from the first container and to control the third container to receive the reducing agent and the substance from the second container. The processor may be configured to control the third container to mix the graphene oxide, water, reducing agent, and substance under sufficient reaction conditions to produce sufficient graphene to coat the substance with graphene to produce a graphene coated substance.

20 Claims, 4 Drawing Sheets

(56) References Cited

U.S. PATENT DOCUMENTS

| | | |
|---|---|---|
| 7,794,836 B2 | 9/2010 | Vasishtha et al. |
| 7,943,687 B2 | 5/2011 | Faucher et al. |
| 2003/0025848 A1 | 2/2003 | Sera et al. |
| 2005/0221978 A1 | 10/2005 | Shiratori et al. |
| 2007/0131915 A1 | 6/2007 | Stankovich et al. |
| 2010/0105834 A1 | 4/2010 | Tour et al. |
| 2010/0292267 A1 | 11/2010 | Khan et al. |
| 2010/0303706 A1 | 12/2010 | Wallace et al. |
| 2011/0014492 A1 | 1/2011 | Joshi et al. |
| 2011/0121240 A1 | 5/2011 | Amine et al. |
| 2011/0133134 A1 | 6/2011 | Varma et al. |
| 2012/0228556 A1* | 9/2012 | Roundhill ............ C01B 31/0446 252/510 |
| 2013/0315814 A1* | 11/2013 | Miller ................. C01B 31/0446 423/448 |
| 2015/0093324 A1* | 4/2015 | Thevasaharam .... C01B 13/0237 423/448 |

OTHER PUBLICATIONS

Leenaerts et al., Graphene: A perfect nanoballoon, Applied Physics Letters, 2008, 193107-193107-3, 93 (19).

http://en.wikipedia.org/wiki/Induction_heating, pp. 1-5, downloaded on May 11, 2012.

Boczkowski & Lanone, Potential uses of carbon nanotubes in the medical field, Nanomedicine 2007, pp. 407-410.

J. Hong et al., Hollow Capsules of Reduced Graphene Oxide Nonosheets Assemebled on a Sacrificial Colloidal Particle, J. Phys. Chem. Lett., 2010, 4 pages.

International Search Report and Written Opinion for application with application No. PCT/US2012/024226 dated Jun. 2, 2011, 11 pages.

"Definition of emulsion in English", Accessed at http://web.archive.org/web/20120731101731/http://oxforddictionaries.com/definition/english/emulsion, Accessed on Feb. 19, 2015, pp. 2.

* cited by examiner

200

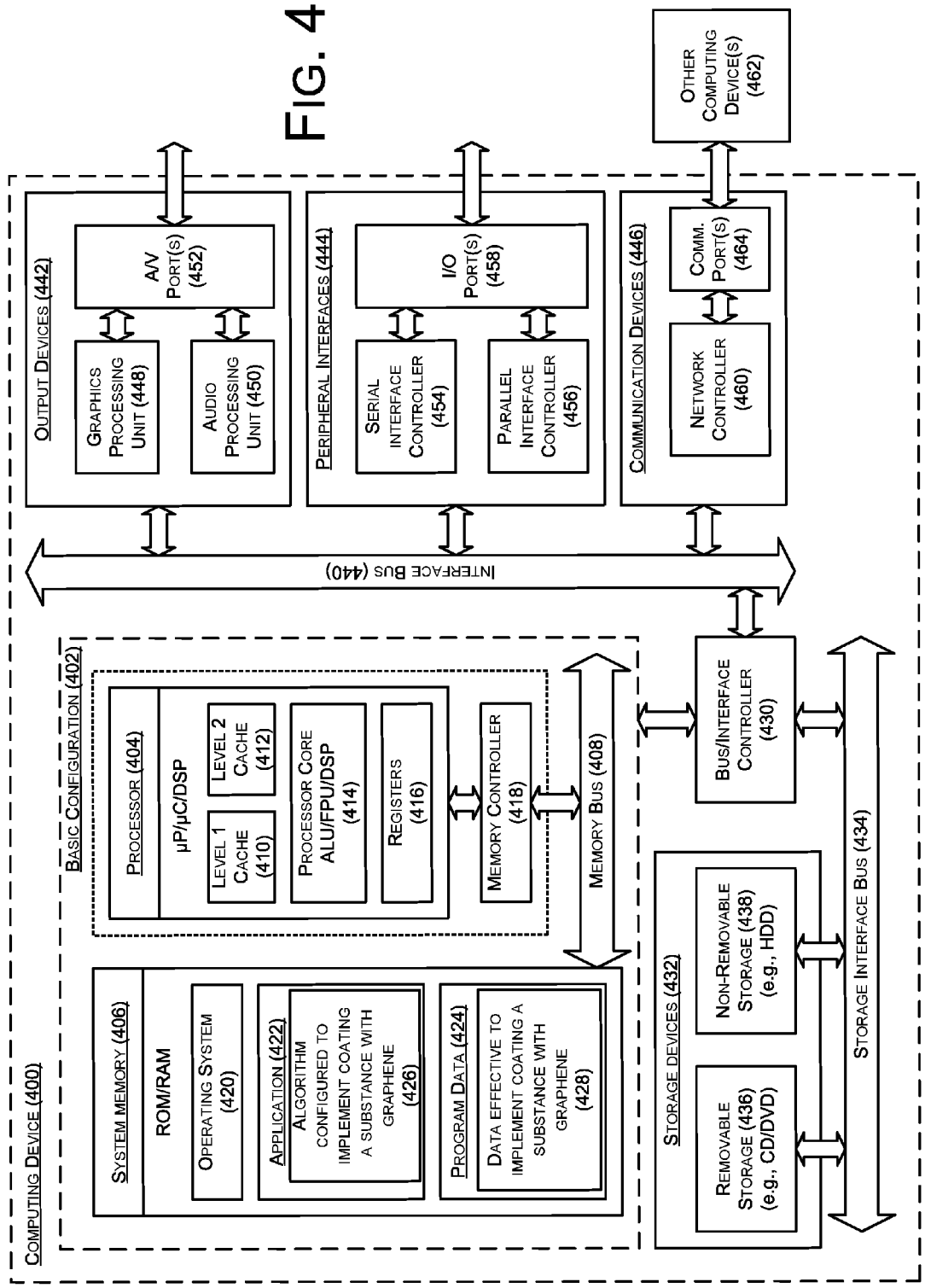

COATING A SUBSTANCE WITH GRAPHENE

CROSS-REFERENCE TO RELATED APPLICATIONS

This application is a continuation under 35 U.S.C. §120 of U.S. application Ser. No. 13/517,458 filed on Jun. 20, 2012, now U.S. Pat. No. 8,691,335, the entirety of this application is hereby incorporated by reference.

BACKGROUND

Unless otherwise indicated herein, the materials described in this section are not prior art to the claims in this application and are not admitted to be prior art by inclusion in this section.

In various fields, chemicals may benefit from protection from their environment until their final intended use. One approach is to encapsulate the chemical with a wall to protect the chemical from the environment. The encapsulation may later be broken to release the chemical.

SUMMARY

In some examples, a method of treating a substance with graphene is generally described. The method may include combining graphene oxide and water to form an aqueous solution. The method may further include contacting a reducing agent and the substance. The method may still further include mixing the aqueous solution with the reducing agent and the substance under sufficient reaction conditions to produce graphene. The method may include producing sufficient graphene to coat the substance with the graphene to produce a graphene coated substance.

In some examples, a system effective to coat a substance with graphene is generally described. The system may include a first container, a second container and a third container. In some examples, the first container may include graphene oxide and water. The second container may include a reducing agent and the substance. The third container may be in operative relationship with the first container and the second container. A processor may be in communication with the first container, the second container, and the third container. The processor may be configured to control the third container to receive the graphene oxide and water from the first container. The processor may be configured to control the third container to receive the reducing agent and the substance from the second container. The processor may be configured to control the third container to mix the graphene oxide, water, reducing agent, and substance under sufficient reaction conditions to produce graphene. The processor may be further configured to control the third container to mix the graphene oxide, water, reducing agent, and substance under sufficient reaction conditions to produce sufficient graphene to coat the substance with the graphene to produce a graphene coated substance.

In some examples an emulsion is generally described. The emulsion may include graphene oxide, a reducing agent, and water. The emulsion may further include graphene coated on a substance.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 4 is a block diagram illustrating an example computing device that is arranged to implement coating of a substance with graphene, all arranged according to at least some embodiments described herein.

DETAILED DESCRIPTION

Figure 1:
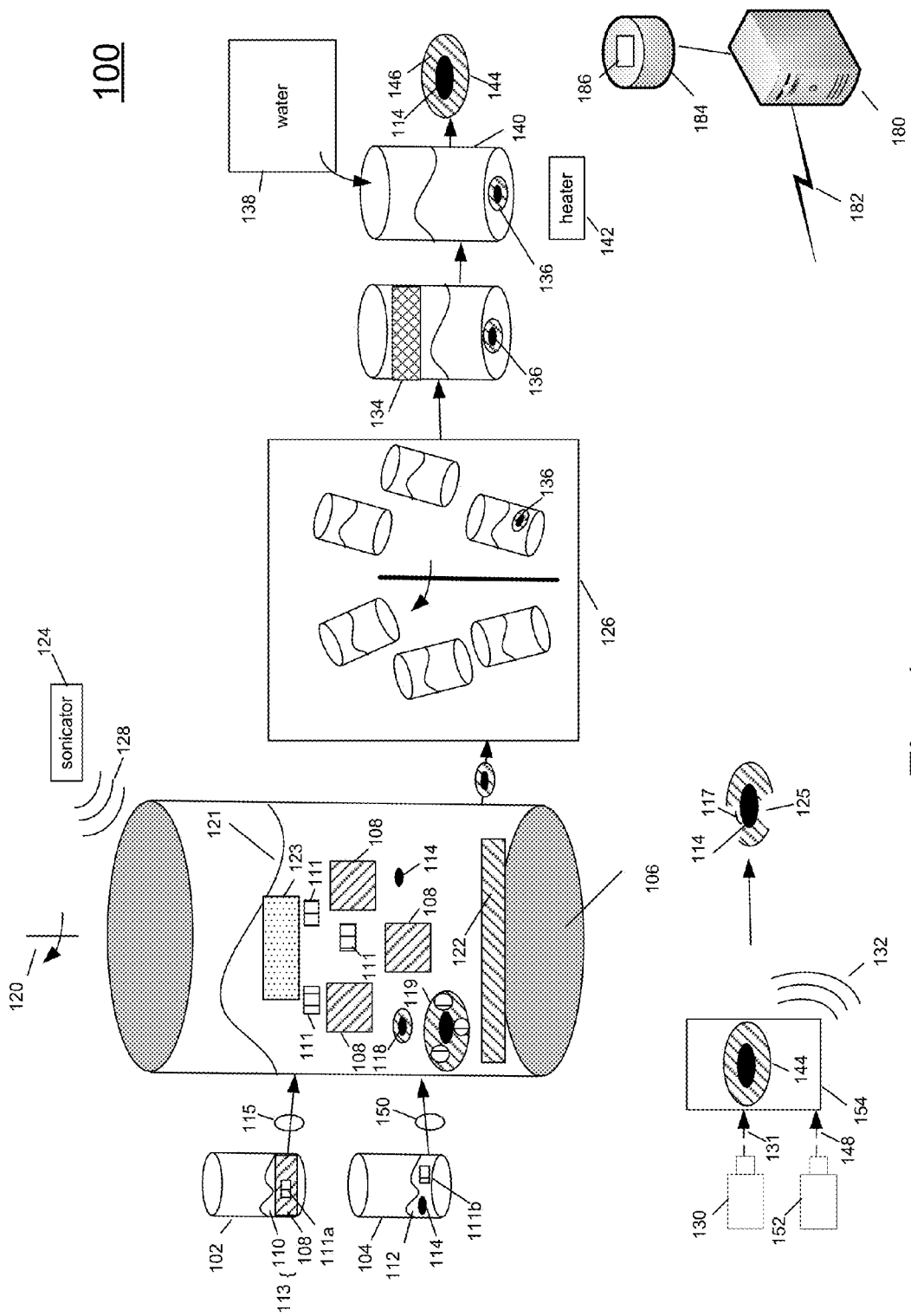
FIG. 1 illustrates an example system that can be utilized to coat a substance with graphene.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to systems, methods, materials and apparatus related to coating a substance with graphene.

Briefly stated, technologies are generally described for a system and process effective to coat a substance with graphene. A system may include a first container including graphene oxide and water and a second container including a reducing agent and the substance. A third container may be operative relationship with the first container and the second container. A processor may be in communication with the first, second and third containers. The processor may be configured to control the third container to receive the graphene oxide and water from the first container and to control the third container to receive the reducing agent and the substance from the second container. The processor may be configured to control the third container to mix the graphene oxide, water, reducing agent, and substance under sufficient reaction conditions to produce sufficient graphene to coat the substance with graphene to produce a graphene coated substance.

It will also be understood that any compound, material or substance which is expressly or implicitly disclosed in the specification and/or recited in a claim as belonging to a group or structurally, compositionally and/or functionally related compounds, materials or substances, includes individual representatives of the group and all combinations thereof.

FIG. 1 illustrates an example system that may be utilized to coat a substance with graphene in accordance with at least some embodiments described herein. An example system 100 effective to coat a substance with graphene may include a first container 102, a second container 104, a third container 106, a sonicator 124, a centrifuge 126, a filter 134 and/or a heater 142 arranged in operative relationship. At least some of these elements may be arranged in communication with a processor 180 through a communication link 182. In some examples, processor 180 may be adapted in communication with a memory 184 that may include instructions 186 stored therein. Processor 180 may be configured, such as by instructions 186, to control at least some of the operations/actions/functions described below.

First container 102 may include an aqueous solution 113 including graphene oxide 108 and water 110. Second container 104 may include a reducing agent 112 and a substance 114. Substance 114 may be coated with graphene as discussed in more detail below. Third container 106 may be in operative relationship with first container 102 and second container 104 through, for example, valves 115, 150. Valves 115, 150 may be configured, such as by control of processor 180, to control a flow of the contents of first container 102 and/or second container 104 into third container 106. Third container 106 may be effective to receive graphene oxide 108 and water 110 from first container 102. In addition, third container 106 may be effective to receive substance 114 and reducing agent 112 from second container 104.

Third container 106 may be effective to mix graphene oxide 108, water 110, reducing agent 112 and substance 114 under sufficient reaction conditions to produce sufficient graphene to coat substance 114 with graphene to produce a graphene coated substance 118. In some examples, the reaction conditions may include forming an emulsion 121 including graphene oxide 108, water 110, reducing agent 112 and substance 114. In some examples graphene coated substance 118 may include graphene and some of reducing agent 112.

Reducing agent 112 may be solvated in an organic solvent. In some examples, reducing agent 112 may include alkyl borane, hydrazine, phenyl hydrazine and/or alkylhydrazine, wherein the alkyl group may contain from about 1 to about 12 carbon atoms. In some examples, graphene coated substance 118 may include graphene which coats both substance 114 and one or both of a portion of reducing agent 112 and a portion of the organic solvent used to solvate reducing agent 112.

Third container 106 may include some unreacted graphene oxide 108 and some of substance 114 not coated with graphene. In addition, third container 106 may also include some graphene 122 formed without coating substance 114. A mixer 120 may be effective to mix the contents in third container 106. In one example, third container 106 may be a homogenizer, compounder, extruder and the like, which may include mixer 120. A sonicator 124 may be effective to apply sound waves 128 to third container 106. Sound waves 128 may be effective to mix graphene oxide 108, water 110, reducing agent 112 and substance 114 and form emulsion 121.

In some examples, centrifuge 126 may be effective to receive graphene coated substance 118, graphene oxide 108, water 110 and reducing agent 112. Centrifuge 126 may spin graphene coated substance 118, graphene oxide 108, water 110 and reducing agent 112 to separate graphene coated substance 118 from graphene oxide 108, water 110 and reducing agent 112. Similarly, filter 134 may be effective to receive graphene coated substance 118, graphene oxide 108, water 110 and reducing agent 112 and separate graphene coated substance 118 from graphene oxide 108, water 110 and reducing agent 112.

An amount of graphene oxide 108 in aqueous solution 113 may vary depending on desired end product, substance 114 and reaction parameters. In some examples, the amount of graphene oxide 108 in aqueous solution 113 may be from about 0.1 weight percent (wt. %) to about 2 wt. %, said weight percent being based on the total weight of water 110 and graphene oxide 108. In some examples the contents of first container 102 may be mixed by sonication or any other method described herein to achieve a uniform dispersion of graphene oxide 108 in water 110.

In some examples, second container 104 may include reducing agent 112 and substance 114 in amounts that provide for a desired concentration or amount of graphene coated substance 118. In some examples, second container 104 may include reducing agent 112 in amounts of from about 0.1 wt. % to about 10 wt. %, where the weight percents are based on the total weight of reducing agent 112, substance 114 and any other components present in second container 104. In some examples second container 104 may include substance 114 in amount of from about 0.5 wt. % to about 1 wt. %. In some examples the contents of second container 104 may be mixed by sonication or any other method described herein to achieve a uniform dispersion of substance 114 in reducing agent 112.

In some examples, the reaction conditions may comprise mixing aqueous solution 113 and reducing agent 112 and substance 114 with mixer 120 for a period of from about 2 minutes to about 1 hour and at a temperature of from about 25° C. to about 80° C. In some examples, the amount of aqueous solution 113 to the amount of reducing agent 112 may be of from about 1:5 to about 5:1 molar equivalents of graphene oxide 108 to molar equivalents of reducing agent 112.

In some examples, mixing aqueous solution 113 with reducing agent 112 may form emulsion 121. In some examples, emulsion 121 may include an oil in water emulsion or a water in oil emulsion. In some examples, emulsion 121 may be a microemulsion, such as an oil in water emulsion wherein at least two physical dimensions of substance 114 to be coated is less than about one micron, such as less than about 500 nm in average particle size. In some examples, reducing agent 112, substance 114 and an organic solvent may form an oil phase of the emulsion and water 110 may form an aqueous phase of the emulsion. In some examples, emulsion 121 may be a homogenous emulsion, such as where the oil phase is homogenously dispersed in the aqueous phase.

In some examples, aqueous solution 113 may include monomer 111 and/or reducing agent 112 may include a monomer 111b. In some examples, monomer 111a in aqueous solution 113 is the same as monomer 111b in reducing agent 112. In some examples monomer 111a may be a different monomer than monomer 111b. In these examples using monomers 111a, and/or 111b, emulsion 121 may produce a graphene and polymer coated substance 119.

A surfactant 123 may be added, such as by hand or machine, to emulsion 121. Surfactant 123 may be, for example, an anionic surfactant, ionic surfactant, amphoteric surfactant and the like. In some examples, surfactant 123 may be sodium dodecyl sulfate.

As discussed above, graphene coated substance 118 may be separated from graphene oxide 108, water 110 and reducing agent 112. In some examples, graphene coated substance 118 may be separated from graphene oxide 108, water 110 and reducing agent 112 using, for example, centrifugation with centrifuge 126 or filtering through filter 134. In some examples, separating the graphene coated substance 118 from the graphene oxide 108, water 110 and reducing agent 112 may produce a separated graphene coated substance 136. Separated graphene coated substance 136 and/or graphene coated substance 118, may be fed into container 140 such as by hand or machine. Separated graphene coated substance 118 and/or graphene coated substance 118 may be rinsed with water from a water source 138 and dried, such as with a heater 142, to produce a rinsed and dried graphene coated substance 144.

Rinsed and dried graphene coated substance 144 may include a graphene wall 146 and substance 114. A portion 125 of graphene wall 146 may be broken to expose at least a portion 117 of substance 114. In some examples, removing portion 117 of graphene wall 146 may be performed by hand or machine by exposing rinsed and dried graphene coated substance 144 to an electromagnetic field as illustrated by arrow 131 emanating from an electromagnetic source 130. Electromagnetic field 131 may be an electric field, a magnetic field, or combination of both electric and magnetic fields. Portion 117 of graphene wall 146 may be removed by application of heat 148 from a heat source 152. Source 152 may be, for example, an oven an inductor, or other source of heat radiation. Portion 117 of graphene wall 146 may also be removed by placing dried and graphene coated substance 144 in a shaker 154 and applying mechanical agitation through shaking as shown at 132.

In examples where an induction coil is used to produce electromagnetic field 131, the size of the coil and the strength of the field generated may depend on the geometry of the sample that is being heated. In an example, heat 148 generated by microwave energy source 152 may be at about a 2 GHz frequency at 1000 W applied for about 10 seconds.

In an example, graphite oxide was synthesized from expanded graphite obtained from SUPRACARBONIC, LLC using the Staudenmaier procedure hereinafter described. Briefly, about 5 g (416.7 mmol C) of expanded graphite was added in five portions to a stirred mixture of concentrated $H_2SO_4$ (about 87.5 mL) and fuming $HNO_3$ (about 45 mL) while cooling in an ice water bath. To the mixture was added $KClO_3$ (about 55 g) in five separate portions for a period of about 15 minutes with sufficient venting using nitrogen gas which resulted in a green slurry. The resulting green slurry was stirred at room temperature for about 96 hours. The green slurry was poured into about 4 L of ice water, and the mixture was filtered and subsequently washed with about 5 L of 5% HCl to produce a filter cake. The filter cake was then rinsed with water until the filter cake was neutral. This was followed by rinsing the filter cake with methanol and diethyl ether, yielding about 4.1 g of a fine brown powder of graphene oxide.

An aqueous graphene oxide solution was created from the graphene oxide powder by sonicating for about 10 minutes 3 mg graphene/ml $H_2O$ with 1% sodium dodecyl sulfate, followed by filtration through glass wool to give a substantially homogenously dispersed aqueous graphene oxide solution. Thereafter, 5 mL paraffin with 1 wt. % phenyl hydrazine and 5 wt. % acetochlor was heated at about 60° C. 50 mL of the aqueous graphene oxide suspension was added to produce a mixture. The mixture was sonicated at about 20 kHz at 70% amplitude with a KS-600, 600 watt system available from NINGBO HAISHU KESHENG ULTRASONIC EQUIPMENT CO., LTD for about 15 minutes to produce an emulsion which included graphene coated acetochlor and paraffin. The emulsion was allowed to cool back to room temperature over 30 minutes, and the graphene coated acetochlor and paraffin were separated by centrifugation followed by 2 further cycles of washing/centrifugation.

In another example, a water-in-oil emulsion was obtained in a similar manner to the previous example. A mixture of 1 wt. % gelatin, 1 wt. % of phenyl hydrazine, 5 wt. % of glycophosphate and 5 ml of the graphene oxide aqueous suspension described in the previous example, was sonicated with 50 mL of olive oil as the oil phase. A water-in-oil emulsion was formed which included graphene coated glycophosphate and gelatin capsules. The resultant capsules were collected by centrifugation and were then washed.

Among other potential benefits, a system in accordance with the disclosure may be used to coat a substance with a graphene wall. The coating process may be self-healing in that if a defect forms in the wall, reducing agent may leak out through the defect and react with graphene oxide to form a wall in the defect area. Volatile chemicals or chemicals that may react in air may be coated and encapsulated to inhibit undesired reactions. As the graphene walls may be conductive, coated substances may be opened from a distance using heat and/or electromagnetic waves. Coated substances may be buried in the ground or otherwise inaccessible and may be opened on demand.

Figure 2:
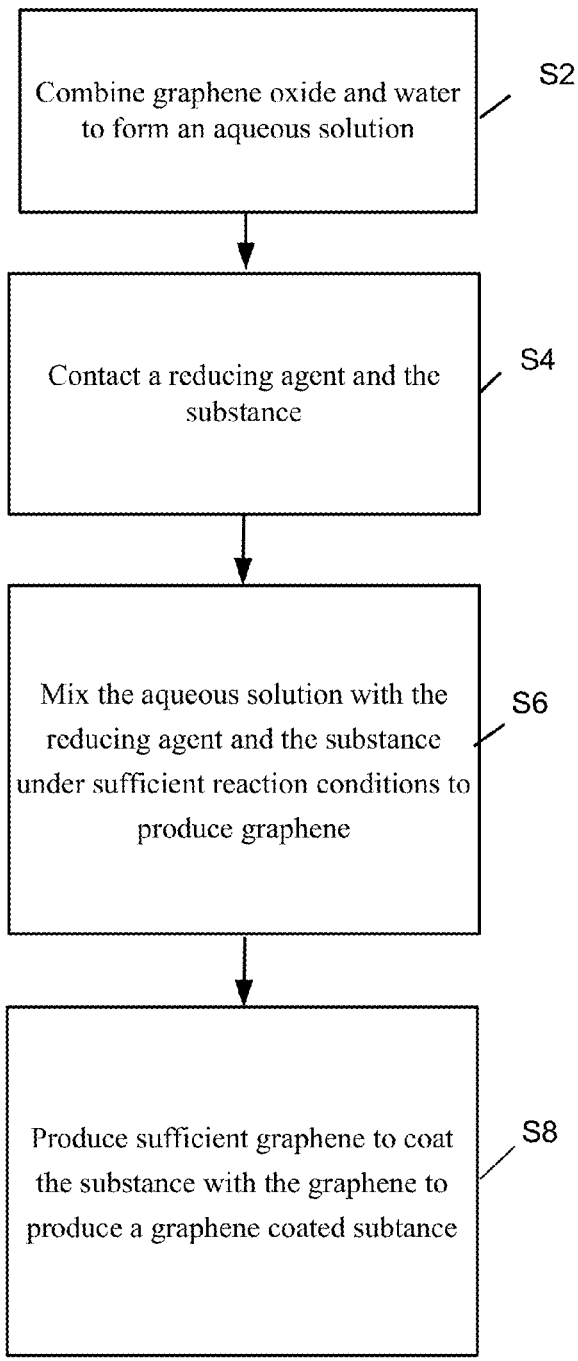
FIG. 2 depicts a flow diagram for an example process for coating a substance with graphene.

FIG. 2 depicts a flow diagram for an example process 200 for coating a substance with graphene in accordance with at least some embodiments described herein. The process in FIG. 2 could be implemented using, for example, system 100 discussed above. An example process may include one or more operations, actions, or functions as illustrated by one or more of blocks S2, S4, S6 and/or S8. Although illustrated as discrete blocks, various blocks may be divided into additional blocks, combined into fewer blocks, or eliminated, depending on the desired implementation.

Process 200 may begin at block S2, "Combine graphene oxide and water to form an aqueous solution." At block S2, graphene oxide may be placed in a container such as by hand or through a machine under control of a processor. The container may have water present or alternatively water may be added to the graphene oxide thereafter by hand or machine.

Processing may continue from block S2 to block S4, "Contact a reducing agent and the substance." At block S4, a reducing agent and a substance to be coated may be placed in contact with one another such as by hand or by machine under control of a processor.

Processing may continue from block S4 to block S6, "Mix the aqueous solution with the reducing agent and the substance under sufficient reaction conditions to produce graphene". Processing may continue from block S6 to block S8, "Produce sufficient graphene to coat the substance with the graphene to produce a graphene coated substance." At blocks S6 and S8, the processor may be configured to control a flow of the aqueous solution to a chamber such as through control of a port in communication with a source of the aqueous solution. The processor may also control a flow of the reducing agent and substance to be coated into the chamber such as through control of a port in communication with a source of the reducing agent and substance. The chamber, such as through control of the processor, may control mixing of the contents of the chamber under sufficient reaction conditions to produce a graphene coated substance. For example, a sonicator or a mixer may be controlled, such as by the processor, to mix the contents of the container to produce an emulsion. The emulsion may cause the graphene oxide to react with the reducing agent to produce the graphene coated substance.

Figure 3:
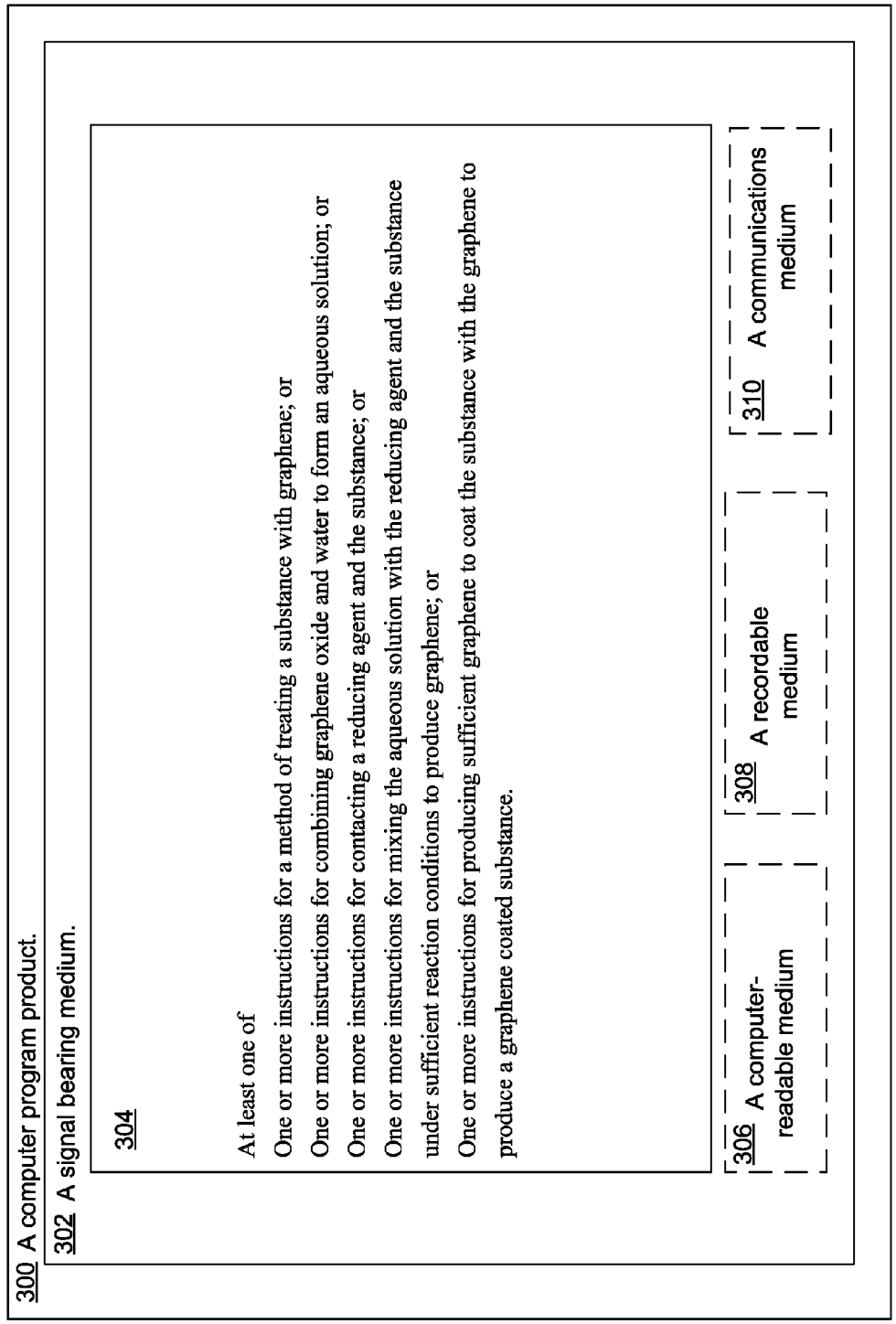
FIG. 3 illustrates a computer program product that can be utilized to implement coating of a substance with graphene.

FIG. 3 illustrates a computer program product that may be utilized to implement coating a substance with graphene in accordance with at least some embodiments described herein. Computer program product 300 may include a signal bearing medium 302. Signal bearing medium 302 may include one or more instructions 304 that, when executed by, for example, a processor, may provide the functionality described above with respect to FIGS. 1-2. Thus, for example, referring to system 100, processor 180 may undertake one or more of the blocks shown in FIG. 3 in response to instructions 304 conveyed to the system 100 by signal bearing medium 302.

In some implementations, signal bearing medium 302 may encompass a computer-readable medium 306, such as, but not limited to, a hard disk drive, a Compact Disc (CD), a Digital Video Disk (DVD), a digital tape, memory, etc. In some implementations, signal bearing medium 302 may encompass a recordable medium 308, such as, but not limited to, memory, read/write (R/W) CDs, R/W DVDs, etc. In some implementations, signal bearing medium 302 may encompass a communications medium 310, such as, but not limited to, a digital and/or an analog communication medium (e.g., a fiber optic cable, a waveguide, a wired communications link, a wireless communication link, etc.). Thus, for example, computer program product 300 may be conveyed to one or more modules of the system 100 by an RF signal bearing medium 302, where the signal bearing medium 302 is conveyed by a wireless communications medium 310 (e.g., a wireless communications medium conforming with the IEEE 802.11 standard).

FIG. 4 is a block diagram illustrating an example computing device that is arranged to implement coating a substance with graphene according to at least some embodiments described herein. In a very basic configuration 402, computing device 400 typically includes one or more processors 404 and a system memory 406. A memory bus 408 may be used for communicating between processor 404 and system memory 406.

Depending on the desired configuration, processor 404 may be of any type including but not limited to a microprocessor (µP), a microcontroller (µC), a digital signal processor (DSP), or any combination thereof. Processor 404 may include one more levels of caching, such as a level one cache 410 and a level two cache 412, a processor core 414, and registers 416. An example processor core 414 may include an arithmetic logic unit (ALU), a floating point unit (FPU), a digital signal processing core (DSP Core), or any combination thereof. An example memory controller 418 may also be used with processor 404, or in some implementations memory controller 418 may be an internal part of processor 404.

Depending on the desired configuration, system memory 406 may be of any type including but not limited to volatile memory (such as RAM), non-volatile memory (such as ROM, flash memory, etc.) or any combination thereof. System memory 406 may include an operating system 420, one or more applications 422, and program data 424. Application 422 may include an algorithm configured to implement coat a substance with graphene 426 that is arranged to perform the various functions/actions/operations as described herein including at least those described with respect to system 100 of FIGS. 1-3. Program data 424 may include data effective to implement coat a substance with graphene 428 that may be useful for implementing coating a substance with graphene as is described herein. In some embodiments, application 422 may be arranged to operate with program data 424 on operating system 420 such that coating of a substance with graphene may be provided. This described basic configuration 402 is illustrated in FIG. 4 by those components within the inner dashed line.

Computing device 400 may have additional features or functionality, and additional interfaces to facilitate communications between basic configuration 402 and any required devices and interfaces. For example, a bus/interface controller 430 may be used to facilitate communications between basic configuration 402 and one or more data storage devices 432 via a storage interface bus 434. Data storage devices 432 may be removable storage devices 436, non-removable storage devices 438, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 406, removable storage devices 436 and non-removable storage devices 438 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 400. Any such computer storage media may be part of computing device 400.

Computing device 400 may also include an interface bus 440 for facilitating communication from various interface devices (e.g., output devices 442, peripheral interfaces 444, and communication devices 446) to basic configuration 402 via bus/interface controller 430. Example output devices 442 include a graphics processing unit 448 and an audio processing unit 450, which may be configured to communicate to various external devices such as a display or speakers via one or more A/V ports 452. Example peripheral interfaces 444 include a serial interface controller 454 or a parallel interface controller 456, which may be configured to communicate with external devices such as input devices (e.g., keyboard, mouse, pen, voice input device, touch input device, etc.) or other peripheral devices (e.g., printer, scanner, etc.) via one or more I/O ports 458. An example communication device 446 includes a network controller 460, which may be arranged to facilitate communications with one or more other computing devices 462 over a network communication link via one or more communication ports 464.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 400 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 400 may also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A system effective to encapsulate a substance with graphene, the system comprising:
    a first container including graphene oxide and water;
    a second container including at least one reducing agent and the substance;
    a third container in operative relationship with the first container and the second container,
    at least one processor in communication with the first container, the second container, and the third container, wherein the processor is configured to:
        control the third container to receive the graphene oxide and water from the first container;
        control the third container to receive the reducing agent and the substance from the second container;
        control the third container to mix the graphene oxide, water, reducing agent, and substance under sufficient reaction conditions to produce graphene; and
        control the third container to mix the graphene oxide, water, reducing agent, and substance under sufficient reaction conditions to produce sufficient graphene to encapsulate the substance with the graphene to produce a graphene encapsulated sub stance.

2. The system of claim 1, further comprising:

at least one sonicator in operative relationship with the third container and in communication with the processor, wherein the processor is effective to control the sonicator to apply sound waves to the third container to mix the graphene oxide, water, reducing agent and substance.

3. The system of claim 1, further comprising:
  at least one centrifuge in operative relationship with the third container and in communication with the processor, wherein the processor is effective to control the centrifuge to
  receive the graphene encapsulated substance, graphene oxide, water and reducing agent; and
  spin the graphene encapsulated substance, graphene oxide, water and reducing agent to separate the graphene encapsulated substance from the graphene oxide, water and reducing agent.

4. The system of claim 1, wherein the reducing agent is at least one of alkylhydrazine and alkylborane.

5. The system of claim 1, further comprising:
  at least one filter in operative relationship with the third container, the filter effective to separate the graphene encapsulated substance from the graphene oxide, water, and reducing agent.

6. The system of claim 1, wherein the mixture of the graphene oxide, water, reducing agent, and the substance creates an emulsion.

7. The system of claim 6, wherein the processor is further configured to control the third container to receive at least one surfactant and to add the surfactant to the emulsion.

8. The system of claim 7, wherein the surfactant is sodium dodecyl sulfate.

9. The system of claim 1, further comprising:
  at least one water source in operative relationship with the third container, the water source effective to provide water to rinse the separated graphene encapsulated substance to produce a rinsed graphene encapsulated substance; and
  at least one heater in operative relationship to the water source, the heater effective to dry the rinsed graphene encapsulated substance.

10. The system of claim 1, further comprising:
  at least one electromagnetic source in operative relationship with the third container, the electromagnetic source configured to expose the graphene encapsulated substance to an electromagnetic field effective to remove an amount of graphene from the graphene encapsulated substance to expose at least a portion of the substance.

11. The system of claim 1, further comprising:
  at least one heat source in operative relationship with the third container, the heat source configured to expose the graphene encapsulated substance to heat effective to remove an amount of graphene from the graphene encapsulated substance to expose at least a portion of the substance.

12. The system of claim 1, further comprising:
  at least one shaker in operative relationship with the third container, the shaker configured to apply mechanical agitation through shaking effective to remove an amount of graphene from the graphene encapsulated substance to expose at least a portion of the substance.

13. A system effective to encapsulate a substance with graphene, the system comprising:
  a first container including graphene oxide and water;
  a second container including a reducing agent and the substance;
  a third container in operative relationship with the first container and the second container,
  at least one sonicator in operative relationship with the third container;
  at least one centrifuge in operative relationship with the third container;
  at least one processor in communication with the first container, the second container, the third container, the sonicator, and the centrifuge, wherein the processor is configured to:
    control the third container to receive the graphene oxide and water from the first container;
    control the third container to receive the reducing agent and the substance from the second container;
    control the sonicator to apply sound waves to the third container to mix the graphene oxide, water, reducing agent and substance under sufficient reaction conditions to produce graphene;
    control the sonicator to apply sound waves to the third container to mix the graphene oxide, water, reducing agent, and substance under sufficient reaction conditions to produce sufficient graphene to encapsulate the substance with the graphene to produce a graphene encapsulated substance;
    control the centrifuge to receive the graphene encapsulated substance, graphene oxide, water and reducing agent; and
    control the centrifuge to spin the graphene encapsulated substance, graphene oxide, water and reducing agent to separate the graphene encapsulated substance from the graphene oxide, water and reducing agent.

14. The system of claim 13, wherein the reducing agent is at least one of alkylhydrazine and alkylborane.

15. The system of claim 13, further comprising:
  at least one water source in operative relationship with the third container, the water source effective to rinse the separated graphene encapsulated substance to produce a rinsed graphene encapsulated substance; and
  at least one heater in operative relationship to the water source, the heater effective to dry the rinsed graphene encapsulated substance.

16. The system of claim 13, further comprising:
  at least one electromagnetic source in operative relationship with the third container, the electromagnetic source configured to expose the graphene encapsulated substance to an electromagnetic field effective to remove an amount of graphene from the graphene encapsulated substance to expose at least a portion of the substance.

17. The system of claim 13, further comprising:
  at least one heat source in operative relationship with the third container, the heat source configured to expose the graphene encapsulated substance to heat effective to remove an amount of graphene from the graphene encapsulated substance to expose at least a portion of the substance.

18. The system of claim 13, further comprising:
  at least one shaker in operative relationship with the third container, the shaker configured to apply mechanical agitation through shaking effective to remove an amount of graphene from the graphene encapsulated substance to expose at least a portion of the substance.

19. A system effective to encapsulate a substance with graphene, the system comprising:
  a first container including graphene oxide and water;
  a second container including a reducing agent and the substance;
  a third container in operative relationship with the first container and the second container,
  at least one sonicator in operative relationship with the third container;
  at least one centrifuge in operative relationship with the third container;

at least one water source in operative relationship with the third container;

at least one heater in operative relationship to the water source;

at least one processor in communication with the first container, the second container, the third container, the sonicator, the centrifuge, the water source, and the heater, wherein the processor is configured to:

control the third container to receive the graphene oxide and water from the first container;

control the third container to receive the reducing agent and the substance from the second container;

control the sonicator to apply sound waves to the third container to mix the graphene oxide, water, reducing agent and substance under sufficient reaction conditions to produce graphene;

control the sonicator to apply sound waves to the third container to mix the graphene oxide, water, reducing agent, and substance under sufficient reaction conditions to produce sufficient graphene to encapsulate the substance with the graphene to produce a graphene encapsulated substance;

control the centrifuge to receive the graphene encapsulated substance, graphene oxide, water and reducing agent;

control the centrifuge to spin the graphene encapsulated substance, graphene oxide, water and reducing agent to separate the graphene encapsulated substance from the graphene oxide, water and reducing agent;

control the water source to rinse the separated graphene encapsulated substance to produce a rinsed graphene encapsulated substance; and control the heater to dry the rinsed graphene encapsulated substance.

20. The system of claim 19, further comprising:

at least one electromagnetic source in operative relationship with the heater, the electromagnetic source configured to expose the graphene encapsulated substance to an electromagnetic field effective to remove an amount of graphene from the graphene encapsulated substance to expose at least a portion of the substance.

\* \* \* \* \*